US005767013A

United States Patent [19]
Park et al.

[11] Patent Number: 5,767,013
[45] Date of Patent: Jun. 16, 1998

[54] METHOD FOR FORMING INTERCONNECTION IN SEMICONDUCTOR PATTERN DEVICE

[75] Inventors: Nae Hak Park, Seoul; Chang Soo Kim; Yun Hee Kim, both of Chungcheongbuk-do, all of Rep. of Korea

[73] Assignee: LG Semicon Co., Ltd., Chungcheongbuk-do, Rep. of Korea

[21] Appl. No.: 778,678

[22] Filed: Jan. 3, 1997

[30] Foreign Application Priority Data

Aug. 26, 1996 [KR] Rep. of Korea ............... 1996/35542

[51] Int. Cl.$^6$ ........................... H01L 21/4763
[52] U.S. Cl. ............... 438/622; 438/633; 438/636; 438/665; 438/690; 438/692
[58] Field of Search ................... 437/195, 228; 438/622, 633, 636, 665, 690, 691, 692, 693, 672

[56] References Cited

U.S. PATENT DOCUMENTS

| | | | |
|---|---|---|---|
| 5,124,780 | 6/1992 | Sandhu et al. | 437/228 |
| 5,219,787 | 6/1993 | Carey et al. | 437/228 |
| 5,461,007 | 10/1995 | Kobayashi | 438/759 |
| 5,534,462 | 7/1996 | Fiordalice et al. | 438/672 |
| 5,563,096 | 10/1996 | Nasr | 438/586 |
| 5,607,718 | 3/1997 | Sasaki et al. | 437/228 |
| 5,639,692 | 6/1997 | Teong | 438/759 |

*Primary Examiner*—Charles L. Bowers, Jr.
*Assistant Examiner*—Lynne A. Gurley

[57] ABSTRACT

A method for forming an interconnection pattern in a semiconductor device for reducing metallic reflection, includes the steps of forming a conductive layer on a substrate, polishing the conductive layer to form a rugged surface on the conductive layer, and selectively removing the polished conductive layer to form the interconnection pattern.

21 Claims, 3 Drawing Sheets

METHOD FOR FORMING INTERCONNECTION IN SEMICONDUCTOR PATTERN DEVICE

BACKGROUND OF THE INVENTION

1. Field of the Invention

The present invention relates to a semiconductor device, and more particularly to a method for forming an interconnection pattern in a semiconductor device which is suitable for reducing metallic reflection.

2. Discussion of the Related Art

In Anti-Reflection Coating (ARC) process for reducing reflection, the inorganic ARC process and the organic ARC process are widely used. In the inorganic ARC process, an appropriate thickness of an ARC film is formed on a metal film which causes a strong reflection during exposure and induces notching effects. Incident lights are absorbed by the ARC film to the maximum, thereby inhibiting notching effects in the exposure. For an ARC film, the inorganic ARC process uses TiN, $SiN_4$ and TiW as inorganic film, whereas the organic ARC process uses polymer as organic film.

A conventional method for forming an interconnection pattern using the ARC process will be explained with reference to the attached drawings.

FIGS. 1a–1d illustrate sectional views for explaining the steps of the conventional process for forming a conventional interconnection pattern in a semiconductor device.

Referring to FIG. 1a, an insulating film 2 is formed on a silicon substrate 1 and a metal film 3 is formed on the insulating film 2. In this instant, step coverage is formed between a portion of the insulating film 2 where a device (not shown) is to be formed and a portion of the insulating film 2 where no device is formed. To reduce reflections from the metal film 3, an ARC film 4 is deposited on the top surface of the metal film 3.

Then, as shown in FIG. 1b, a photoresist 5 is coated on the ARC film 4, and exposed and developed to pattern the photoresist 5. The photoresist 5 is used as a mask for selectively etching the ARC film 4 and the metal film 3. Since the etch selectivity of the ARC film 4 is different from that of the metal film 3, some portions of the metal film 3 under the ARC film 4 are etched excessively, as shown in FIG. 1c. The photoresist pattern 5 is completely removed and an interlayer insulating film 6 is formed thereon, as shown in FIG. 1d. The conventional process for fabricating an interconnection pattern in a semiconductor device is thereby finished.

The aforementioned conventional method for forming an interconnection pattern in a semiconductor device has at least the following problems.

First, the method is complicated because it requires the ARC film forming process.

Second, there is difficulty in controlling etch selectivity for the ARC film and the metal film. Due to the difficult, overetching of the metal film occurs.

Third, overetching of the metal film causes formation of unnecessary gaps in a planarizing film formed thereon.

SUMMARY OF THE INVENTION

Accordingly, the present invention is directed to a method for forming an interconnection pattern in a semiconductor device that substantially obviates one or more of the problems arising from limitations and disadvantages of the related art.

An object of the present invention is to provide a method for forming an interconnection pattern in a semiconductor device which is suitable for reducing metallic reflection.

Another object of the present invention is to provide a method for forming an interconnection pattern in a semiconductor device which can simplify the fabrication process and improve reliability of a planarizing insulating film formed in the semiconductor device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for forming an interconnection pattern in a semiconductor includes the steps of forming a conductive layer on a substrate, polishing the conductive layer for forming a rugged surface on the conductive layer, and selectively removing the conductive layer for forming an interconnection pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings, wherein.

DETAILED DESCRIPTION OF THE PREFERRED EMBODIMENTS

Reference will now be made in detail to the preferred embodiments of the present invention, examples of which are illustrated in the accompanying drawings.

FIGS. 2a–2e illustrate sectional views showing steps of a process for forming an interconnection pattern in a semiconductor device in accordance the embodiments of the present invention.

Figure 1A:
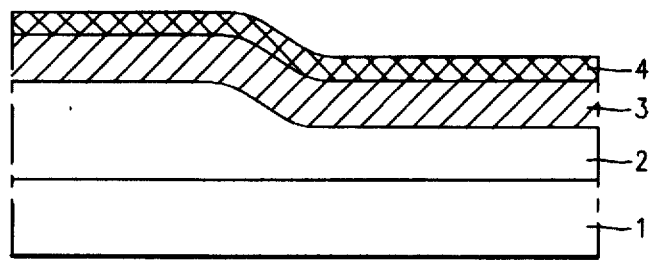
FIGS. 1a–1d illustrate sectional views showing the steps of a conventional process for forming an interconnection pattern in a semiconductor device.
Figure 1B:
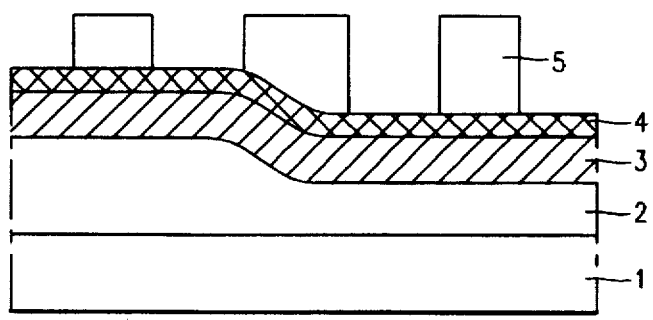
Figure 1C:
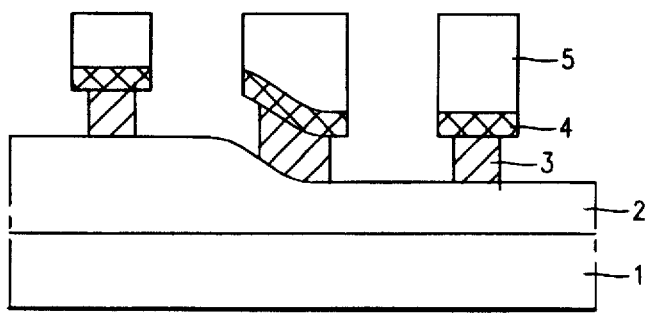
Figure 1D:
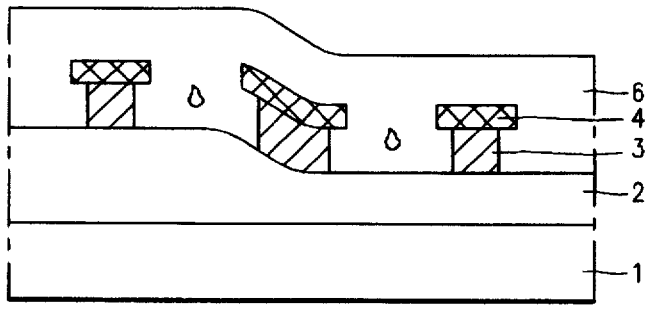
Figure 2A:
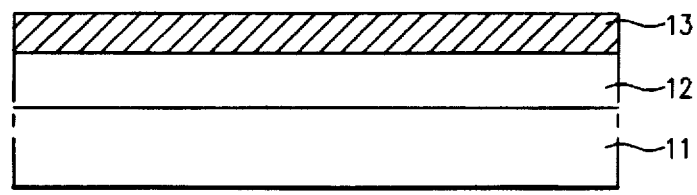
FIGS. 2a–2e illustrate sectional views showing the steps of a process for forming an interconnection pattern in a semiconductor device in accordance with the embodiments of the present invention.

Referring to FIG. 2a, an insulating film 12 is formed on a substrate 11. The material for the substrate 11 is either a semiconductor material or an insulative material, and the material for the insulating film 12 is either an oxide or a nitride. A metal film 13 is formed on the insulating film 12. An alloy film can be formed instead of the metal film 13. The metal film 13 is formed of one of Al, W, Cr and Cu, and the alloy film is formed of silicon and one selected from Al, W, Cr and Cu.

Figure 2B:
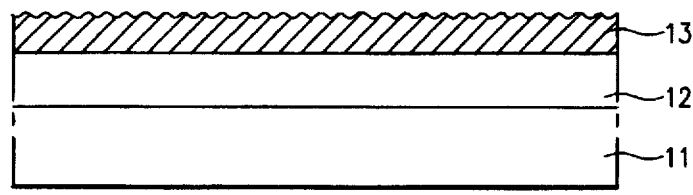

Referring to FIG. 2b, the metal film 13 is subjected to CMP (Chemical Mechanical Polishing) to make the surface of the metal film 13 rugged and to prevent reflections therefrom.

A method for making the surface of the metal film 13 rugged using CMP will be explained.

In the CMP process, urethane or polyester is used as a pad, and alumina ($Al_2O_3$) particles as an abrasive and chemicals, such as HF, KOH, HCl, $H_2O_2$, $H_2O$, are used.

In CMP, a pad is fixed on a plate, and a mixture of abrasive and chemical is injected through a polishing liquid feed pipe into the center of the plate which is being rotated. A surface of the wafer fixed to a chuck, which is rotated in a direction opposite to the rotation direction of the plate, is polished on the pad as the wafer reacts with the injected mixture. Due to the reaction, the metal film formed on the surface of the wafer is polished.

Polishing may be a chemical mechanical polishing or mechanical polishing, depending on the composition of the mixture of a polishing liquid. In case of chemical mechanical polishing, the composition of polishing liquid may be $Al_2O_3$ (alumina) particles+(HF or HCl)+$H_2O_2$+$H_2O$. Therefore, mechanical polishing is carried out by the $Al_2O_3$ particles, and chemical polishing is carried out by HF or HCl. In case of mechanical polishing, the composition of a polishing liquid may be $Al_2O_3$ particles+$H_2O$. The mechanical polishing is carried out by the $Al_2O_3$ particles mechanically only. The ruggedness of the top surface of the metal film 13 is dependent on the size of $Al_2O_3$ particles. Here, the size of the $Al_2O_3$ particles is about 200~1000 Å, and the thickness of the polished metal film 13 is about 100~500 Å. Different $Al_2O_3$ particle sizes can be used to obtain a desired polished thickness for the metal film.

Figure 2C:
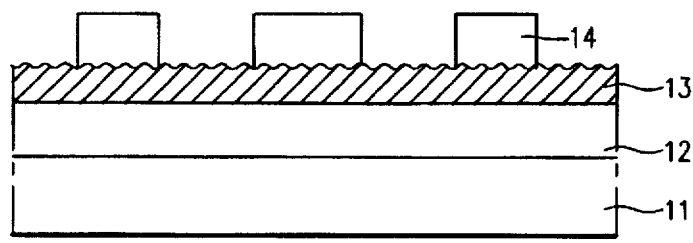
Figure 2D:
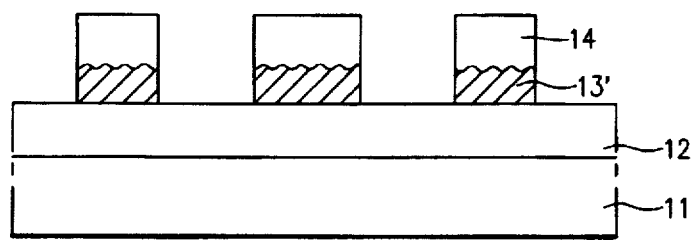

Referring to FIG. 2c, a photoresist is coated on the polished metal film 13, and exposed and developed using an interconnection pattern mask (not shown) to form a photoresist pattern 14. As shown in FIG. 2d, the photoresist pattern 14 is used as a mask in subjecting the metal film 13 to anisotropic etching for forming a metal interconnection pattern 13'.

Figure 2E:
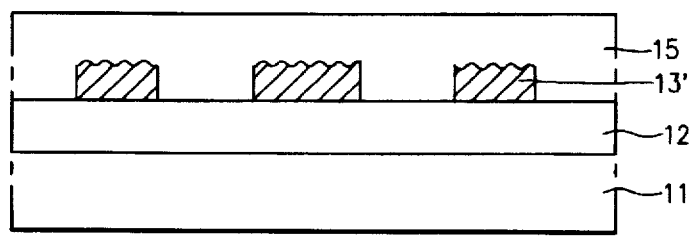

Referring to FIG. 2e, the photoresist pattern 14 is completely removed and a planarizing insulating film 15 is formed on the metal interconnection pattern 13' and the insulating film 12.

FIGS. 3a–3e show steps for forming a polished metal film on a stepped substrate in a semiconductor device according to the embodiments of the present invention. To polish the metal film formed on a stepped substrate, a flexible pad is used in the CMP process. That is, in order to make a simultaneous abrasion of the upper and lower portions of the step in the metal film, a flexible pad is used to control abrasive force.

The steps for forming a polished metal film on a stepped substrate are similar to the steps shown in FIGS. 2a–2e, which will be discussed below.

Figure 3A:
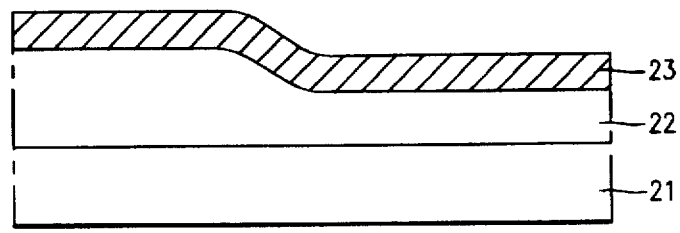
FIGS. 3a–3e illustrate another exemplary sectional views showing the steps of a process for forming an interconnection pattern in a semiconductor device in accordance with the embodiments of the present invention.

Referring to FIG. 3a, an insulating film 22 and a metal film 23 are formed on a substrate 21, wherein one or more layers 21–23 have a step therein. The material for the substrate 21 is either a semiconductor material or an insulative material, the material for the insulating film 22 is either an oxide or a nitride, and the metal film 23 is formed of one of Al, W, Cr, and Cu. An alloy film can be used instead of the metal film 23 and the alloy film can be formed of silicon and one selected from Al, W, Cr and Cu.

Figure 3B:
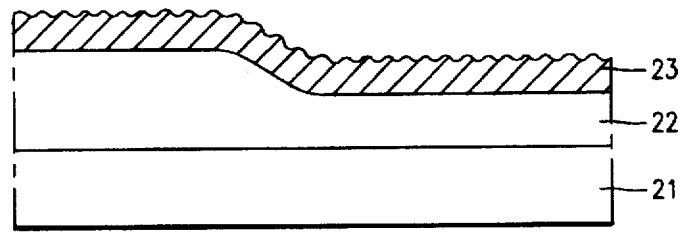

Referring to FIG. 3b, the metal film 23 is subjected to a CMP (Chemical Mechanical Polishing) process to make the surface of the metal film 23 rugged and to prevent reflections therefrom. In the CMP process, urethane or polyester as a pad, alumina ($Al_2O_3$) particles as abrasive, and chemicals, such as HF, KOH, HCl, $H_2O_2$, $H_2O$, are used. Polishing may be a chemical mechanical polishing or a mechanical chemical polishing, depending on the composition of the mixture of polishing liquid.

In case of chemical mechanical polishing, the composition of a polishing liquid may be $Al_2O_3$ (alumina) particles+ (HF or HCl)+$H_2O_2$+$H_2O$. Therefore, mechanical polishing is carried out by the $Al_2O_3$ particles, and chemical polishing is carried out by HF or HCl. In case of mechanical polishing, the composition of a polishing liquid may be $Al_2O_3$ particles+$H_2O$. The mechanical polishing is carried out by the $Al_2O_3$ particles mechanically only. The ruggedness of the top surface of the metal film 23 is dependent on the size of $Al_2O_3$ particles. Here, the size of the $Al_2O_3$ particles is about 200~1000 Å, and the thickness of the polished metal film 13 is about 100~500 Å. Different $Al_2O_3$ particle sizes can be used to obtain a desired polished thickness for the metal film.

Figure 3C:
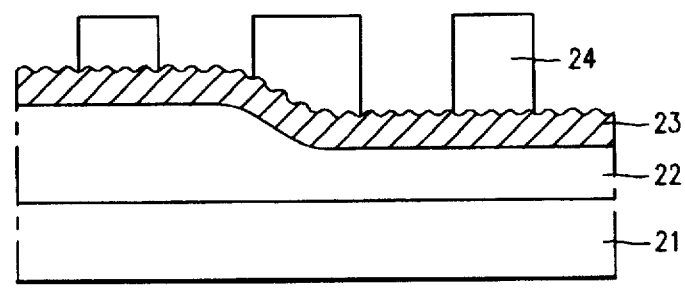
Figure 3D:
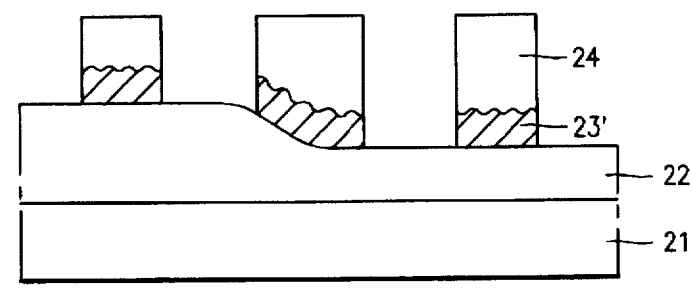
Figure 3E:
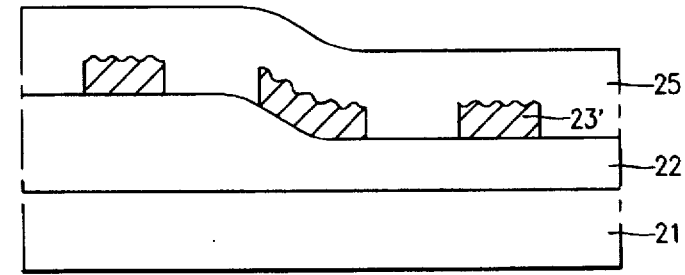

Referring to FIG. 3c, a photoresist is coated on the polished metal film 23, and exposed and developed using an interconnection pattern mask (not shown) to form a photoresist pattern 24. As shown in FIG. 3d, the photoresist pattern 24 is used as a mask in subjecting the metal film 23 to anisotropic etching for forming a metal interconnection pattern 23'. The photoresist pattern 24 is completely removed and a planarizing insulating film 25 is formed on the metal interconnection pattern 23' and the insulating film 22 as shown in FIG. 3e.

The method for forming an interconnection pattern in a semiconductor device according to the embodiments of the present invention has the following advantages.

First, the rugged surface of the metal film reduces reflection from the metal surface when exposing the metal film to form a metal film pattern. It inhibits occurrence of notching (distortion of a photoresist pattern). Notching occurs due to lights scattered from the surface of the metal film and due to interference of lights arising when a photoresist is deposited and exposed to form the photoresist pattern.

Second, the entire fabrication process is simplified since no ARC process is required for reducing reflections from the metal film.

Third, etch selectivity for metal etching and profile need not be taken into account in order to avoid overetching.

Fourth, since accurate patterning of the metal film allows no gaps to be formed in the planarizing insulating film formed on the metal film, reliability of the planarizing insulating film is improved.

It will be apparent to those skilled in the art that various modifications and variations can be made in the methods for fabricating the semiconductor device according to the present invention without departing from the spirit or scope of the invention. Thus, it is intended that the present invention covers the modifications and variations of this invention provided they come within the scope of the appended claims and their equivalents.

What is claimed is:

1. A method for forming an interconnection pattern in a semiconductor device, comprising the steps of:

forming a conductive layer on a substrate;

polishing the conductive layer to increase the ruggedness of a surface of the conductive layer for reducing reflection from the conductive layer; and removing portions of the polished conductive layer to form an interconnection pattern.

2. A method as claimed in claim 1, wherein the substrate is formed of either a semiconductor material or an insulative material.

3. A method as claimed in claim 1, wherein the conductive layer is formed of one selected from metals or alloys.

4. A method as claimed in claim 1, wherein the polishing step includes the step of:

performing a chemical mechanical polishing process on the surface of the conductive layer.

5. A method as claimed in claim 3, wherein the conductor layer is formed of one selected from Al, W, Cr and Cu.

6. A method as claimed in claim 1, wherein the polishing step includes the step of:

performing a mechanical polishing process on the surface of the conductive layer.

7. A method as claimed in claim 1, wherein a thickness of the polished conductive layer is about 100~500 Å.

8. A method as claimed in claim 1, further comprising of the step of:

forming an insulating film between the substrate and the conductive layer.

9. A method as claimed in claim 1, wherein the step of removing portions of the conductive layer includes the steps of:

forming a photoresist layer on the polished conductive layer, exposing and developing the photoresist layer to form a photoresist pattern on the polished conductive layer, and removing the portions of the polished conductive layer using the photoresist pattern as a mask to expose portions of the substrate and to form the interconnection pattern.

10. A method as claimed in claim 1, further comprising the step of:

forming a planarizing insulating layer directly on the rugged surface of the polished conductive layer and on the substrate, so as to fill gaps of the interconnection pattern with the planarizing insulating layer.

11. A method as claimed in claim 4, wherein the chemical mechanical polishing process includes use of a polishing liquid composed of $Al_2O_3$ particles+(HF or HCl)+$H_2O_2$+$H_2O$.

12. A method as claimed in claim 11, wherein a thickness of the polished conductive layer is about 100~500 Å.

13. A method as claimed in claim 6, wherein the mechanical polishing process includes use of a polishing liquid composed of $Al_2O_3$ particles+$H_2O$.

14. A method as claimed in claim 13, wherein a thickness of the polished conductive layer is about 100~500 Å.

15. A method as claimed in claim 1, wherein the conductive layer formed on the substrate includes a step.

16. A method as claimed in claim 1, wherein the polishing includes the step of:

forming a rugged top surface on the conductive layer; and wherein the removing step includes the steps of:

forming a photoresist layer directly over the entire rugged top surface of the conductive layer, patterning the photoresist layer to form a photoresist pattern, and removing the portions of the polished conductive layer using the photoresist pattern as a mask.

17. A method as claimed in claim 16, further comprising the step of:

forming a planarizing insulating layer directly on the rugged top surface of the polished conductive layer and on the substrate so that gaps of the interconnection pattern are filled with the planarizing insulating layer.

18. A method as claimed in claim 1, wherein the polishing step includes use of a polishing liquid composed of $Al_2O_3$ particles+(HF or HCl)+$H_2O_2$+$H_2O$.

19. A method as claimed in claim 18, wherein the size of the $Al_2O_3$ particles is about 200~1000 Å.

20. A method as claimed in claim 1, wherein the polishing step includes use of a polishing liquid composed of $Al_2O_3$ particles+$H_2O$.

21. A method as claimed in claim 1, wherein the forming step includes the step of:

depositing a conductive material directly on a substantially flat substrate, so that the conductive layer is substantially flat.

\* \* \* \* \*